United States Patent Office 3,489,603

Patented Jan. 13, 1970

3,489,603

SURFACE PRETREATMENT PROCESS

Cederick U. Darter and John F. Peck, Scottsdale, Ariz., assignors to Motorola, Inc., Franklin Park, Ill., a corporation of Illinois No Drawing. Filed July 13, 1966, Ser. No. 564,755
Int. Cl. C23f *17/00;* C23c *13/02;* C23g *1/02*
U.S. Cl. 117—213 3 Claims

ABSTRACT OF THE DISCLOSURE

A process for pretreating a surface of a metal body prior to plating the surface thereof with a metal is disclosed. The process includes the step of subjecting the surface of the metal body to an aqueous bath containing a water soluble nickel salt, a mineral acid and water.

This invention relates to a pretreatment of a surface prior to the plating of a second metal coating thereon. More particularly, the invention relates to the pretreatment of a surface of a semiconductor structure prior to the plating of a second metal thereon and the formation of an ohmic contact.

An ohmic contact is an electrical connection whose electrical resistance does not vary to any significant extent with variation in polarity and voltage across it. The resistance of this contact is also essentially unaffected by the amount of current passing through it. The formation of a stable ohmic contact, that is, one whose characteristics do not change with time, is important in the fabrication of semiconductor devices. The advantage of low operating power requirements for certain semiconductor devices is lost if a suitable ohmic contact cannot be formed thereon.

To form ohmic contacts utilizing nickel on a wafer of silicon, the nickel coating has generally been deposited by a process such as electroless nickel, nickel carbonyl or evaporative plating. Either during or after the plating of the nickel, the wafer is heated to a temperature in excess of about 600° C. If the wafer is not heated to this temperature, the contact that is formed generally has a high resistance and results in undesirable power consumption and operating characteristics. It is believed that this high resistance is partially a result of a thin oxide layer on the surface of the silicon. Because of the reactivity of silicon and other less noble metals, a thin oxide layer forms very rapidly on surfaces exposed to air or other oxidizing conditions. Although this layer is often on the order of a few atomic layers thick, it is believed sufficient to be detrimental to the formation of an ohmic contact. Therefore, when forming ohmic contacts by prior methods, an elevated temperature was believed necessary to alloy or sinter the nickel with the silicon substrate to penetrate this oxide layer.

Additionally, to initiate the electroless plating of nickel on silicon, it was necessary to roughen the surface to be plated. The necessity of roughening the surface is undesirable because of the physical damage incurred and the adverse effects on device characteristics.

It is an object of this invention to provide a process for forming an ohmic contact on a wafer of semiconductor material that requires fewer processing steps, is less expensive and is more reliable than processes previously used.

It is another object of this invention to provide a process for forming an ohmic contact having relatively low contact resistance on a wafer of silicon without heating the wafer to very high temperatures.

It is another object of this invention to provide a process for forming a low resistance ohmic contact on a wafer of semiconductor material with a finely polished or epitaxially formed surface without roughening that surface.

A feature of the invention is a pretreatment of a surface of a metal body with an acidic nickel bath prior to the plating of a metal thereon.

Another feature of this invention is a novel aqueous bath for the pretreatment of a surface of a metal body prior to plating a metal thereon.

The invention is embodied in a process for pretreating a surface of a body of metal prior to plating the surface thereof with a metal, which process includes the step of subjecting the surface to an aqueous bath comprising a water-soluble nickel salt, a mineral acid and water.

Metals suitable for treatment in accordance with the process of the invention are metals less noble than nickel as determined by their electrode potential. Metals are classified according to their electrode potential in a graduated order known as the electromotive series. The relative reactivities of metals may be generally determined by considering their location in this series. Gold, which is known as a noble metal because it is relatively unreactive, is at one end of the series whereas sodium and aluminum, which are relatively reactive, are at the other end of the series. Metals are often categorized as being more noble or less noble than another metal according to their relative positions in the electromotive series. The semiconductor metals, although normally not listed in the electromotive series, are considered in their activity relative to the other metals to be similar to aluminum.

This invention is preferably used for pretreatment of a body of semiconductor material, particularly a wafer of silicon, that has been cut from a large single crystal. The wafer prior to processing into a semiconductor device is generally lapped, mechanically or chemically polished and otherwise treated to obtain the desired wafer thickness and a smooth, clean surface. The final layer on these wafers may be formed by epitaxial techniques, and therefore, have an exceptionally smooth surface. These wafers are typically between six and twelve mils thick and between about one and two inches in diameter. Prior to the pretreatment of the invention, in the fabrication of devices, the wafers will generally have regions of different conductivity types formed therein by well known diffusion and epitaxial techniques and be subjected to other high temperature operations that alter the electrical properties of the wafer but have little effect upon the surface quality. The process of this invention is especially advantageous on chemically polished or wafers with surfaces formed by epitaxial techniques.

The nickel component of the pretreatment bath is advantageously obtained from a water-soluble nickel salt such as nickel chloride, nickel nitrate, nickel carbonate, nickel sulfate, etc. For the pretreatment of a silicon wafer, a nickel halide such as nickel chloride is preferred. The nickel salt utilized should be readily soluble in an aqueous bath and compatible with the mineral acid utilized, that is, no precipitate should be formed when the nickel salt is mixed with the acid in the aqueous bath.

The mineral acid utilized in the bath is preferably an acid capable of etching the oxide of the metal to be treated. Although the mechanism of the pretreatment is not known, the use of an acid with good etching capabilities improves the quality of the pretreatment. Furthermore, compatibility of the acid with the nickel salt is important. Mineral acids that are suitable for the process of the invention include hydrochloric acid, hydrofluoric acid, nitric acid, sulfuric acid or combinations thereof.

Effective treatment may be obtained with a broad range of concentrations for the components comprising the aqueous bath. Nickel chloride concentrations between about 150 grams per liter and a saturated solution (about 642 grams per liter at 20° C.) have been satisfactorily used. Preferably, the concentration of nickel chloride will be in excess of 250 grams per liter. The $Ni^{++}$ ion concentration of the solution is advantageously between about 2 and 4 mole percent at 20° C. The concentration of the mineral acid will vary according to the condition of the surface of the metal and particularly the type of oxide thereon. For silicon, concentrations between about 2% and 25% by volume of hydrofluoric acid produce good results. For a suitable pretreatment rate, an acid concentration between about 1 and 13 mole percent is preferable. Advantageously, the bath temperature is maintained below 100° C., and preferably between about 20° and 25° C., during the pretreatment step. Generally, the bath is utilized at an ambient temperature and therefore does not require specialized heating equipment.

Pretreatment according to the invention is accomplished by subjecting a body of metal with a clean surface, that is, substantially free of oxides or other contaminants, to an aqueous bath prepared as above. If the surface is not clean, the effectiveness and rate of pretreatment is reduced. The period of time for which the body is immersed in the bath is generally between about 10 seconds and one minute. This period is partially dependent upon the properties of the surface undergoing treatment. Although the exact mechanism of the pretreatment is not known, it is believed the action may be similar to a galvanic displacement. It is thought that as the oxide is removed from the surface of the metal, nickel atoms are bound to the resulting open metal bonds or replace exposed silicon atoms.

Although it is postulated that a thin nickel layer is formed because epitaxial and chemically polished wafers will not initiate electroless nickel plating and a nickel layer will, there is no observable nickel coating formed on any other alteration in the surface appearance of the wafer. Even when the wafer remains in the solution for an extended period, no change occurs in the surface appearance. Thus, if a nickel layer is formed, it may be only a few atoms thick.

The following examples illustrate specific embodiments of the invention, although it is not intended that the examples restrict the scope of the invention.

EXAMPLE I

A number of silicon wafers having the basic structure for two-terminal four-layer diodes, with surfaces which were clean except for oxides that normally form upon exposure to air, were placed in a clean Teflon basket so that both sides of the wafers were exposed. The surfaces of these wafers were smooth. The wafers were then subjected to pretreatment by immersing the basket with the wafers therein in an aqueous bath. The aqueous bath contained about 250 grams of nickel chloride, 375 milliliters of 48% hydrofluoric acid and sufficient water to make a volume of one liter. This bath was maintained at a temperature of about 20° C. The wafers were immersed in this bath for about one minute. The wafers were then removed from the bath and rinsed immediately in water to remove residual bath chemicals.

The wafers thereafter were immersed in a boiling water bath for about 15 seconds and then immersed in a conventional electroless nickel plating solution containing nickel chloride, sodium hypophosphite and citric acid. The solution was maintained at about 97° C. The wafers remained in the electroless nickel plating solution until between about 5 and 10 microinches of nickel were plated thereon, requiring about 90 seconds. The wafers were removed from the electroless nickel solution, rinsed with water and permitted to dry.

An ohmic contact thusly formed has been found to have a contact resistance about one-third that of contacts fabricated with prior art methods. When a wire lead was soldered to this contact and a pull applied thereto, fracture and separation occurred on the silicon or solder, but not at the solder-silicon interface.

EXAMPLE II

Silicon wafers having regions of different conductivity type that terminated on a surface thereof with a thick glass layer disposed thereon, were coated with a conventional etch resistant photosensitive material and masked according to known techniques. The wafers were placed in a Teflon basket and immersed in an etchant to remove the glass from selected areas to expose the silicon thereunder. Upon completion of the etching, the wafers in the basket were carefully rinsed and promptly immersed in an aqueous bath for treatment prior to plating. The aqueous bath contained about 640 grams of nickel chloride, 50 milliliters of 48 percent hydrofluoric acid and sufficient water to make a volume of one liter. This bath was maintained at room temperature and the wafers immersed therein for about 10 seconds. After this pretreatment the wafers were electroless nickel plated as previously described in Example I.

The electroless nickel plating adhered solely to the areas in which the silicon had been exposed and did not adhere to the glass covering the remainder of the wafer. Ohmic contacts having similar superiorities to those of Example I were achieved.

The above description and examples show that the present invention provides a novel pretreatment of a surface of a metal prior to the plating of a second metal thereon. Furthermore the present invention provides a process for forming an ohmic contact on a wafer of semiconductor material that requires fewer processing steps, is less expensive and more reliable than previous processes. Moreover, the process of the invention provides an ohmic contact that has relatively low contact resistance on a wafer of silicon without heating the wafer to a high temperature. Also, this contact may be formed on a wafer with a finely polished or epitaxially deposited surface without roughening of that surface.

We claim:

1. A process for pretreating a surface of a body of silicon prior to the electroless plating of nickel on said surface which comprises subjecting said surface to an aqueous bath consisting of (a) about 2 to 4 mole percent water-soluble nickel salt selected from the group consisting of nickel chloride, nickel halide, nickel nitrate, nickel carbonate and nickel sulphate, (b) about 1 to 13 mole percent mineral acid selected from the group consisting of HCl, HBr, HF, $HNO_3$, $H_2SO_4$ and combinations thereof and water, said nickel salt being compatible with said acid in said bath.

2. A process for pretreating a surface according to claim 1 in which said mineral acid is a hydrogen halide.

3. A process according to claim 1 including the subsequent steps of rinsing said body in water and subjecting said body to an electroless nickel plating solution to form an ohmic contact thereon.

References Cited

UNITED STATES PATENTS

| | | | |
|---|---|---|---|
| 3,393,091 | 7/1968 | Hartmann | 117—213 |
| 3,397,450 | 8/1968 | Bittman | 117—200 |

OTHER REFERENCES

Electroless Plating Today, Dr. E. B. Saubestre, Metal Finishing, July 1962, pp. 49 and 50.

RALPH S. KENDALL, Primary Examiner

WM. E. BALL, Assistant Examiner

U.S. Cl. X.R.

117—47, 49, 130, 160, 213, 227